(12) United States Patent
Nakayama et al.

(10) Patent No.: US 8,563,950 B2
(45) Date of Patent: Oct. 22, 2013

(54) ENERGY BEAM DRAWING APPARATUS AND METHOD OF MANUFACTURING DEVICE

(75) Inventors: Takahiro Nakayama, Utsunomiya (JP); Shigeru Terashima, Utsunomiya (JP)

(73) Assignee: Canon Kabushiki Kaisha (JP)

( * ) Notice: Subject to any disclaimer, the term of this patent is extended or adjusted under 35 U.S.C. 154(b) by 0 days.

(21) Appl. No.: 13/353,571

(22) Filed: Jan. 19, 2012

(65) Prior Publication Data

US 2012/0181455 A1 Jul. 19, 2012

(30) Foreign Application Priority Data

Jan. 19, 2011 (JP) ................................ 2011-009198

(51) Int. Cl.
- H01J 37/317 (2006.01)
- G03F 7/20 (2006.01)
- H01L 31/18 (2006.01)
- B82Y 10/00 (2011.01)
- B82Y 40/00 (2011.01)

(52) U.S. Cl.
CPC ............ *H01J 37/317* (2013.01); *G03F 7/70925* (2013.01); *B82Y 10/00* (2013.01); *B82Y 40/00* (2013.01)
USPC ........ 250/492.1; 250/306; 250/307; 250/309; 355/30; 355/53

(58) Field of Classification Search
USPC ............ 250/306, 307, 309, 492.1; 355/30, 53
See application file for complete search history.

(56) References Cited

U.S. PATENT DOCUMENTS

| | | | |
|---|---|---|---|
| 6,704,539 B2 * | 3/2004 | Nakayama | 399/350 |
| 7,064,324 B2 * | 6/2006 | Onishi | 250/310 |
| 7,208,731 B2 * | 4/2007 | Onishi | 250/310 |
| 7,262,408 B2 * | 8/2007 | Asmussen et al. | 250/306 |
| 7,355,672 B2 * | 4/2008 | Van Herpen et al. | 355/30 |
| 7,414,700 B2 * | 8/2008 | Van Herpen et al. | 355/53 |
| 7,449,692 B2 * | 11/2008 | Onishi | 250/310 |
| 7,473,908 B2 * | 1/2009 | Van Herpen et al. | 250/492.2 |
| 7,561,247 B2 * | 7/2009 | Van Herpen et al. | 355/30 |
| 7,671,347 B2 * | 3/2010 | Ehm et al. | 250/492.2 |
| 7,868,304 B2 * | 1/2011 | Bakker et al. | 250/492.2 |
| 8,049,188 B2 * | 11/2011 | Metzmacher et al. | 250/492.2 |

(Continued)

FOREIGN PATENT DOCUMENTS

JP 2009049438 A 3/2009

OTHER PUBLICATIONS

Kasai, Hideaki, "Electron Stimulated Desorption of H from Metal Surfaces", Department of Applied Physics, Faculty of Engineering, Osaka University, Dec. 25, 1989.

*Primary Examiner* — David A Vanore
(74) *Attorney, Agent, or Firm* — Rossi, Kimms & McDowell LLP

(57) ABSTRACT

An energy beam drawing apparatus includes a member, positioned between an energy beam source and a substrate, on which a deposit is deposited and a removing unit which removes the deposit. The removing unit includes a catalyst for generating, from a gas, an active species for decomposing the deposit by irradiation with the energy beam, a supplying mechanism for supplying the gas to a position where the active species is generated, and a moving mechanism for moving, when executing processing of removing the deposit, the catalyst to a first position which is irradiated with the energy beam, and moving, when executing drawing processing on the substrate, the catalyst to a second position which is not irradiated with the energy beam.

10 Claims, 3 Drawing Sheets

(56) References Cited

U.S. PATENT DOCUMENTS

| | | |
|---|---|---|
| 2005/0206018 A1* | 9/2005 | Ohmi et al. ............ 257/E21.525 |
| 2006/0072084 A1* | 4/2006 | Van Herpen et al. ............ 355/30 |
| 2006/0175558 A1* | 8/2006 | Bakker et al. ............... 250/492.2 |
| 2006/0289753 A1* | 12/2006 | Onishi ........................... 250/310 |
| 2007/0040999 A1* | 2/2007 | Van Herpen et al. ............ 355/30 |
| 2007/0152150 A1* | 7/2007 | Onishi ........................... 250/309 |
| 2008/0011967 A1* | 1/2008 | Van Herpen et al. ....... 250/492.2 |
| 2008/0083878 A1* | 4/2008 | Ehm et al. ...................... 250/372 |
| 2009/0309045 A1* | 12/2009 | Metzmacher et al. ..... 250/492.1 |
| 2010/0127153 A1* | 5/2010 | Agarwal ....................... 250/200 |
| 2011/0079704 A1* | 4/2011 | Yu et al. ...................... 250/208.1 |
| 2012/0181455 A1* | 7/2012 | Nakayama et al. ......... 250/492.1 |
| 2012/0183905 A1* | 7/2012 | Terashima et al. ............. 430/296 |

* cited by examiner

F I G. 1
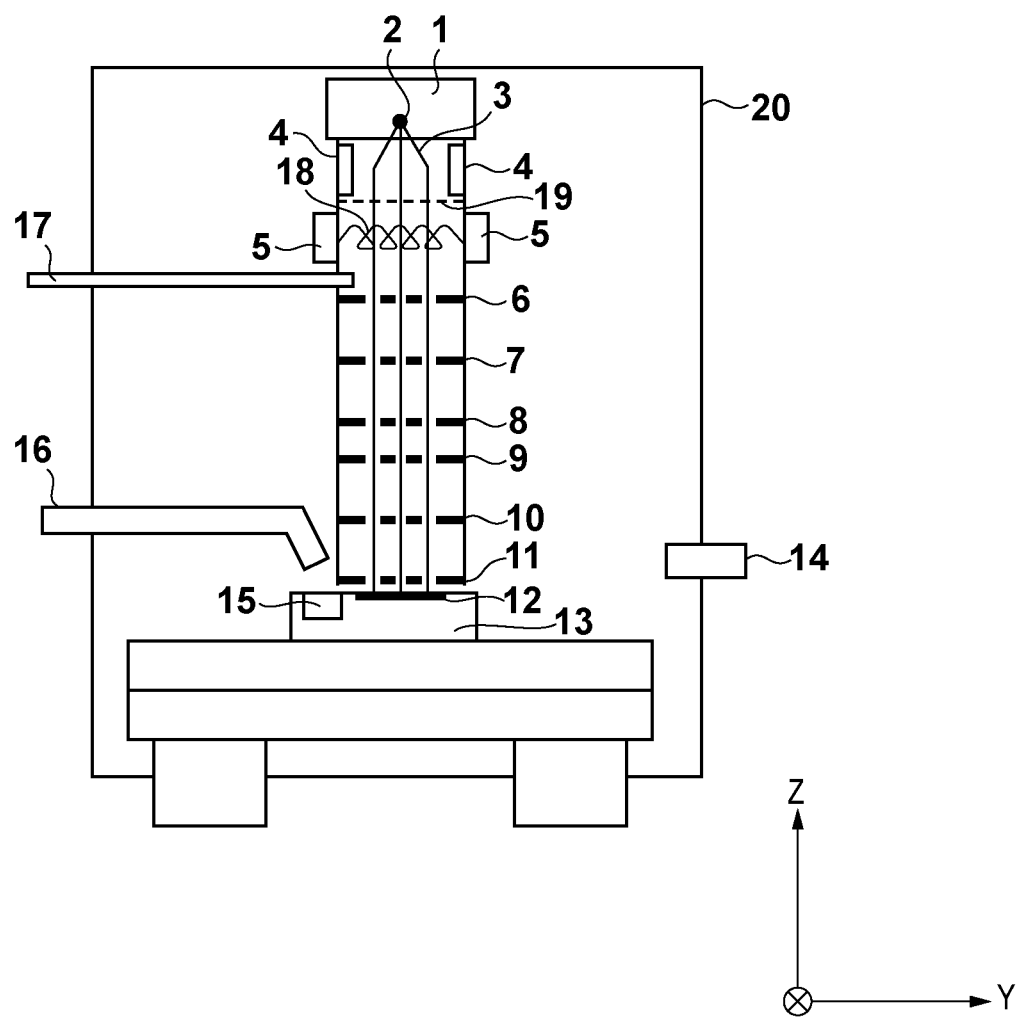

ENERGY BEAM DRAWING APPARATUS AND METHOD OF MANUFACTURING DEVICE

BACKGROUND OF THE INVENTION

1. Field of the Invention

The present invention relates to an energy beam drawing apparatus and a method of manufacturing a device.

2. Description of the Related Art

Japanese Patent Laid-Open No. 2009-049438 discloses a technique of decomposing and removing deposits such as carbon materials deposited on an optical member using hydrogen radicals in a charged-particle beam drawing apparatus serving as an exposure apparatus. Japanese Patent Laid-Open No. 2009-049438 also describes a technique of generating hydrogen radicals from hydrogen using at least one of a heatable filament, plasma generator, radiation source, and catalyst. Furthermore, in Kasai, "Electron Stimulated Desorption of H+ from Metal Surfaces", Surface Science, Vol. 11, No. 5, pp. 274-280 (1990), there is disclosed a technique of generating hydrogen radicals by irradiating a catalyst with an electron beam while supplying hydrogen gas to the catalyst.

Japanese Patent Laid-Open No. 2009-049438 discloses a view that shows a case where hydrogen radicals are generated from hydrogen by a tungsten or tantalum hot filament heated to about 2,000 to 2,300 K. If the hot filament is positioned near an optical member on which a deposit has formed, the optical member is heated to be distorted, thereby decreasing the drawing accuracy. If the hot filament is positioned away from the optical member, the hydrogen radicals generated by the action of the hot filament are deactivated before reaching the optical member on which the deposit has formed, thereby decreasing the decomposition of the deposit. If a catalyst is used, the same problems arise.

SUMMARY OF THE INVENTION

The present invention provides a drawing apparatus for efficiently removing a deposit forming on a member.

The present invention provides a drawing apparatus for drawing a pattern on a substrate using an energy beam generated by an energy beam source, the apparatus comprising: a member which is positioned between the energy beam source and the substrate and on which a deposit is deposited; and a removing unit which removes the deposit, the removing unit including a catalyst for generating, from a gas, an active species for decomposing the deposit by irradiation with the energy beam, a supplying mechanism for supplying the gas to a position where the active species is generated, and a moving mechanism for moving, when executing processing of removing the deposit, the catalyst to a first position which is irradiated with the energy beam, and moving, when executing drawing processing on the substrate, the catalyst to a second position which is not irradiated with the energy beam.

Further features of the present invention will become apparent from the following description of exemplary embodiments with reference to the attached drawings.

BRIEF DESCRIPTION OF THE DRAWINGS

FIG. 1 is a view showing a drawing apparatus according to the first embodiment;

DESCRIPTION OF THE EMBODIMENTS

First Embodiment

Figure 2:
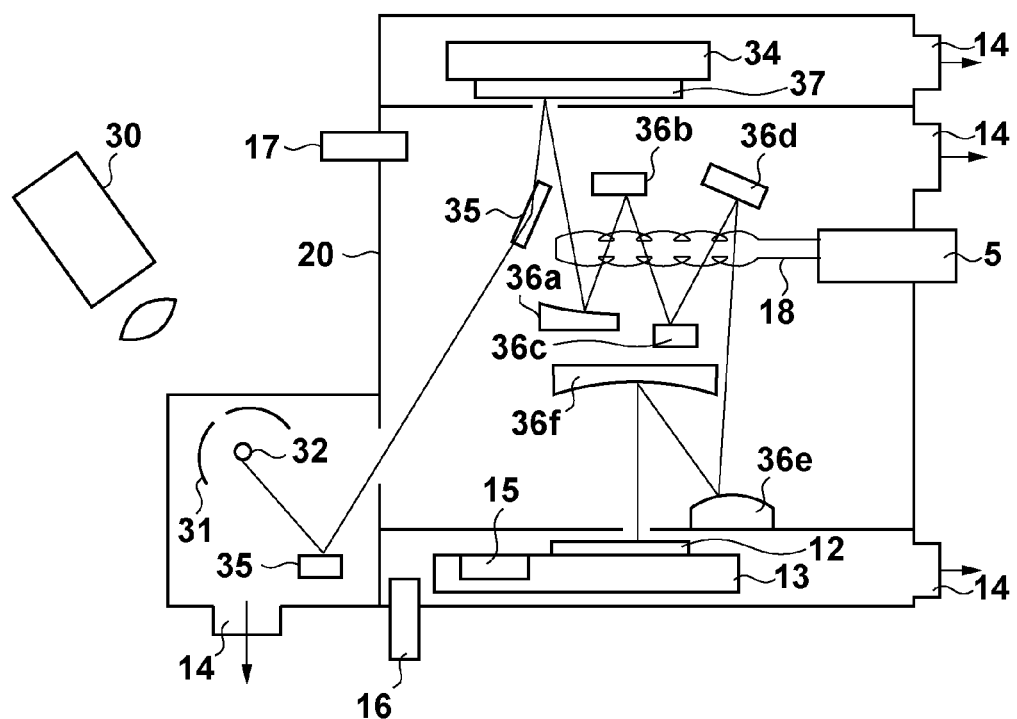
FIG. 2 is a view showing a drawing apparatus according to the second embodiment.

A drawing apparatus according to the first embodiment serves as an electron beam drawing apparatus which executes drawing processing of drawing a pattern on a substrate using an electron beam. Referring to FIG. 1, an electron gun 1 forms a crossover 2, and emits an electron beam 3 from the crossover 2. The electron gun 1 constitutes an energy beam source for generating an electron beam as an energy beam. The electron beam 3 emitted by the crossover 2 becomes a parallel beam by the action of a collimator lens 4, and enters an aperture array 6 constituting a charged-particle beam optical system. The aperture array 6 has a plurality of circular openings positioned in a matrix topology, and divides the incident electron beam 3 into a plurality of electron beams. The electron beams which have passed through the aperture array 6 enter a first electro-static lens array 7 including three electrode plates (collectively shown in FIG. 1) each having circular openings.

A stopping aperture array 9 in which small openings are positioned in a matrix topology is disposed at a position where the electron beam 3, which has passed through the electro-static lens array 7, first forms a crossover. A blanker array 8 executes a blanking operation of the stopping aperture array 9. The electron beam 3 which has passed through the stopping aperture array 9 is imaged by a second electro-static lens array 11 to image an original image of the crossover 2 on a substrate 12 such as a wafer or mask. During the drawing processing, the substrate 12 is continuously moved in the x direction by a stage 13, and the image on the substrate 12 is deflected in the y direction by a deflector 10 with respect to a real time length measurement result by a laser length measuring machine, and is blanked by the blanker array 8. With the above drawing processing, it is possible to form a desired latent image on a resist.

These members are positioned between the electron gun 1 and the substrate 12 within a chamber 20. The electron beam drawing apparatus comprises an exhausting mechanism such as a vacuum pump, and can form a vacuum environment (for example, a pressure of 1E-5 Pa or lower) within the chamber 20 by exhausting air from an exhaust port 14. Especially since an electronic lens portion is required to have a high degree of vacuum, an exhaust system may be arranged apart from a stage portion in which a lot of gas is generated.

In such an electron beam drawing apparatus, a deposit may form on the collimator lens 4, aperture array 6, first electro-static lens array 7, blanker array 8, stopping aperture array 9, deflector 10, second electro-static lens array 11, and the like. The collimator lens 4, aperture array 6, first electro-static lens array 7, blanker array 8, stopping aperture array 9, deflector 10, second electro-static lens array 11, and the like constitute a member (or second member) on which a deposit forms. The deposit includes, for example, a carbon deposited material due to outgas emitted by the members forming the electron beam drawing apparatus or a carbon compound emitted from a resist applied onto the substrate 12.

The deposit is positively or negatively charged when it is irradiated with the electron beam 3 or secondary electrons or reflected electrons generated by the electron beam 3, and thus the electrons of the electron beam 3 are applied with an attractive force or repulsive force, thereby removing the electrons of the electron beam 3 from a desired trajectory. Especially the second electro-static lens array 11 near the resist is strongly influenced by the carbon deposited material emitted by the resist. A deposit yielded by the reaction of the carbon material emitted by the resist in drawing a pattern on the substrate 12 and the simultaneously generated secondary electrons tends to form on the second electro-static lens array 11. Since the aperture array 6 is far from the resist, the influence of the carbon material emitted by the resist is small. Since, however, the aperture array 6 is near the electron gun 1, it is irradiated with the electron beam 3 with high illuminance. As the illuminance of the electron beam 3 is higher, a deposit generation speed becomes higher. Many deposits, therefore, adhere to the aperture array 6.

In this embodiment, the electron beam drawing apparatus has a removing unit for decomposing and removing a deposit from a member (or second member) on which the deposit has formed, which decomposes the deposit by the reaction of the deposit and active species (radicals) generated by the removing unit near the member. The removing unit includes the electron beam 3, a first catalyst 18, a first gas introducing pipe (supplying mechanism) 17, a moving mechanism 5 for the first catalyst, a second catalyst 15, a second gas introducing pipe 16, and the stage 13 serving as a moving mechanism for the second catalyst. The active species generated by the removing unit has high reactivity. If, therefore, the separation between the catalyst and the member on which the deposit exists is long, the active species is deactivated before reaching the deposit, and the amount of the active species decreases, thereby reducing the decomposition ability of the deposit. In this embodiment, when executing removal processing, it is possible to move the first catalyst 18 or second catalyst 15 close to the member the deposit of which is desired to be removed, thereby enabling to generate an active species near the deposit. In this case, the degree of deactivation of the active species before reaching the deposit is low, and it is possible to decompose the deposit with a high concentration of active species.

The arrangement and function of each component of the removing unit will be described below by exemplifying removal processing. The moving mechanism 5 for the first catalyst and the stage 13 move the first catalyst 18 and second catalyst 15 from the second position which is not irradiated with the electron beam 3, to the first position which is irradiated with the electron beam. The second catalyst 15 is positioned at a position, on the stage which is mounted with the substrate 12, where the substrate 12 is not mounted. The second catalyst 15, therefore, can be moved by the stage 13 between the first position which is irradiated with the electron beam 3 and the second position which is not irradiated with the electron beam 3. The first catalyst 18 forms a catalyst positioned on the energy source side, and the second catalyst 15 forms a catalyst positioned on the stage side.

A moving mechanism for moving the second catalyst 15 is not limited to the stage 13 supporting the substrate 12. An additional dedicated stage may be provided, and a moving mechanism may be arranged on it. As the second catalyst 15, a catalyst formed to have the same shape as that of the substrate 12 may be used. In this case, the moving mechanism (not shown) moves the second catalyst 15 between a position where the second catalyst 15 is stored and a position on the stage 13 where the substrate 12 is mounted. This eliminates the need for reserving a position on the stage 13 where the second catalyst 15 is arranged, thereby decreasing the size of the stage 13. The first moving mechanism 5 moves the first catalyst 18 between the first position which is irradiated with the electron beam 3 and the second position which is not irradiated with the electron beam 3. A pulse motor serving as a driving mechanism may be used as the first moving mechanism 5, and a well-known technique is applicable.

When executing processing of removing a deposit, the first catalyst 18 and second catalyst 15 are moved to a position which is irradiated with at least part of the electron beam 3. In this embodiment, the second catalyst 15 is a plate catalyst and the first catalyst 18 is a wire catalyst. The present invention, however, is not limited to them. For example, the first catalyst 18 may be a mesh (reticulated) catalyst. That is, to execute removal processing, it is effective that the first catalyst 18 is irradiated with part of the electron beam 3, and the second catalyst 15 is irradiated with another part of the electron beam 3.

As exemplified in this embodiment, if the first catalyst 18 is a wire catalyst, part of the electron beam 3 can pass through the first catalyst 18. It is, therefore, possible to simultaneously irradiate the first catalyst 18 and second catalyst 15 with the electron beam 3. In this case, since it is possible to simultaneously execute removal processing for a plurality of members, it is also possible to shorten the time required for the removal processing. A catalyst which has the same functions as those of the first catalyst 18 and second catalyst 15 may be provided for another member. The third catalyst and a moving mechanism for the third catalyst may be provided between the aperture array 6 and the blanker array 8. Providing the third catalyst allows to supply a high concentration of active species to the aperture array 6 and blanker array 8, thereby enabling efficient cleaning.

Figure 3:
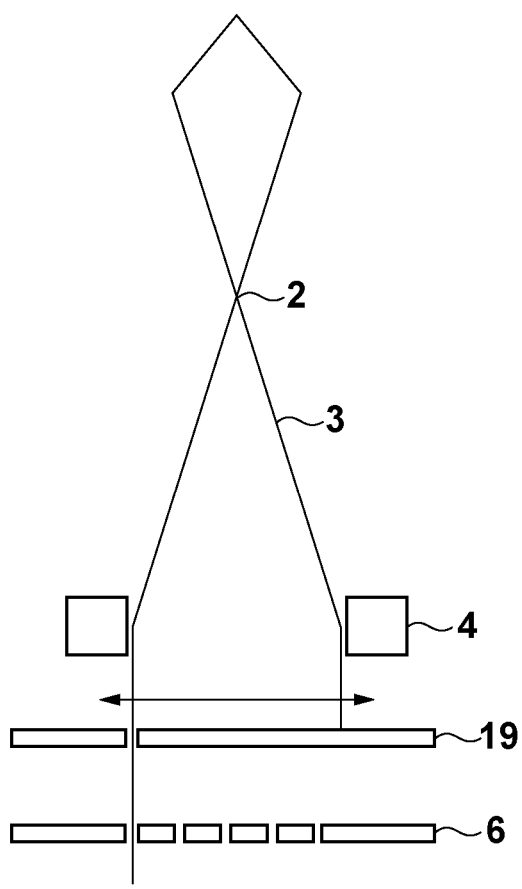
FIG. 3 is a view showing an example of a restricting mechanism.
Figure 4:
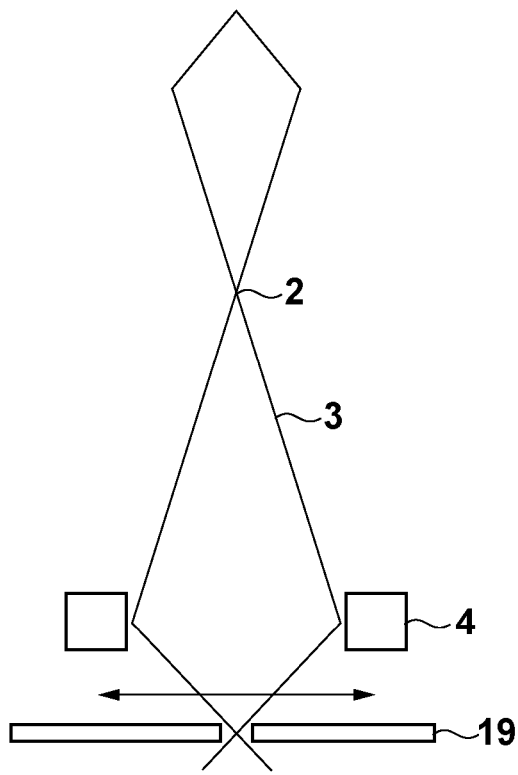
FIG. 4 is a view showing another example of the restricting mechanism.

An orifice plate 19 serves as a restricting mechanism for restricting intrusion of gas, which is supplied from the second gas introducing pipe 16 and the first gas introducing pipe 17, into the electron gun 1. The orifice plate 19 is, for example, a plate member having an opening which an electron beam emitted by the electron gun 1 passes through, and is movable in a direction perpendicular to the passing direction of the electron beam. FIG. 3 shows an example of the orifice plate 19. Referring to FIG. 3, only part of the electron beam 3 emitted by the crossover 2, which has passed through the opening of the orifice plate 19, enters the aperture array 6. The orifice plate 19 has a driving mechanism, which moves the orifice plate 19 so that the electron beam 3 sequentially enters all the openings of the aperture array 6. FIG. 4 shows a case in which the collimator lens 4 causes the electron beam 3 to converge. With this operation, it is possible to pass the electron beam 3 with high current through the orifice plate 19 downstream. An additional electronic optical system may be provided between the orifice plate 19 and the crossover 2 to converge the electron beam 3.

If it is desired to give a pressure difference of two or more orders of magnitude between the front and rear sides of the orifice plate 19, the area of the opening of the orifice plate 19 need only be 7.9 mm$^2$ or smaller in total. The orifice plate 19, therefore, may have a plurality of small openings, the total area of which is equal to or smaller than 7.9 mm$^2$. With this arrangement, it is possible to suppress flow, into the electron gun 1, of the gas which is supplied from the first gas introducing pipe 17 or second gas introducing pipe 16, and also prevent deterioration of the electron gun 1 due to irradiation with the electron beam 3 while the gas is supplied. Although the orifice plate 19 is provided between the collimator lens 4 and the aperture array 6 in this embodiment, it may be provided between the electron gun 1 and the collimator lens 4.

The first gas introducing pipe 17 and second gas introducing pipe 16 supply a gas to the first catalyst 18 and second catalyst 15, respectively. The gas supplied by the first gas introducing pipe 17 and second gas introducing pipe 16 is supplied near the first catalyst 18 and second catalyst 15, respectively. The gas may be supplied while exhausting it from the exhaust port 14 or the gas may be supplied without exhausting it. To execute removal processing, power supply to a member is stopped before supplying a gas. This can prevent electric discharge from occurring between the electrodes of members when a gas is supplied. To generate the electron beam 3, a control system (not shown) controls to supply, to the members, a voltage such that electric discharge does not occur between the electrodes of the members.

When a gas is supplied and then a desired pressure, for example, 0.1 to 100 Pa is reached near the first catalyst 18 and second catalyst 15, the first catalyst 18 and the second catalyst 15 are irradiated with the electron beam 3. The timing of irradiating each catalyst is not limited to this. After the first catalyst 18 is irradiated with the electron beam 3 to remove a deposit near the first catalyst 18, it may be removed from the path of the electron beam 3 and the second catalyst 15 may be irradiated with the electron beam 3. The first catalyst 18 and second catalyst 15 may be irradiated with the electron beam 3 when the setting conditions of the members are different from those in the drawing processing. For example, the members may be set so that the beam diameter of the electron beam 3 at the location of the substrate 12 is larger than that in the drawing processing. When irradiation with the electron beam 3 starts, an active species is generated, the generated active species reacts with deposits on the members, and the deposits are removed. The removed deposits are exhausted outside the chamber 20 via exhaust port 14.

Upon completion of removal of the deposits, irradiation with the electron beam 3 is stopped, and supply of the gas from the first gas introducing pipe 17 and second gas introducing pipe 16 is also stopped. Whether removal of the deposits is complete may be determined, by irradiating an alignment mark (not shown) with the electron beam 3, depending on whether desired optical characteristics are reconstructed. Alternatively, when a preset period of time elapses, it may be determined that the deposits have been removed. The moving mechanism 5 for the first catalyst and the stage (the moving mechanism for the second catalyst) 13 move the first catalyst 18 and second catalyst 15 to a position which is not irradiated with the electron beam 3, and then the removal processing ends.

FIG. 1 shows a case in which deposits are removed from the aperture array 6 (member) and the second electro-static lens array 11 (second member). A deposit may be removed from another member. According to this embodiment, when executing a removal operation, a catalyst is moved to a position which is irradiated with an electron beam near a member on which a deposit forms. It is, therefore, possible to generate an active species near the deposit. Since there is the deposit near the catalyst, the degree of deactivation of the active species becomes low, thereby enabling to supply a high concentration of active species to the deposit. With this processing, it is possible to shorten the time required to decompose the deposit, thereby improving the productivity (throughput) of the drawing apparatus.

In addition to the above arrangement, at least some of the first gas introducing pipe 17, the second gas introducing pipe 16, the stage 13, and the member may be formed by a material which can suppress deactivation of the active species. For example, by exemplifying hydrogen radicals as an active species, a material for which the consumption probability of hydrogen radials is 0.2 or smaller, such as $SiO_2$, is applied. Assume that 90% of hydrogen radicals are consumed when hydrogen atoms collide against the material surface once. In this case, if the hydrogen radicals collide against the material surface 10 times, the consumption probability becomes 0.2.

Each of the first catalyst 18 and second catalyst 15 can generate an active species by reacting with a gas from the first gas introducing pipe 17 or second gas introducing pipe 16, and contains at least one of, for example, tungsten, platinum, molybdenum, nickel, rhenium, and tantalum. The gas which can generate an active species by reacting with the first catalyst 18 or second catalyst 15 contains at least one of, for example, hydrogen, ammonia, oxygen, and nitrogen. The generated active species includes, for example, hydrogen radicals, nitrogen radicals, and oxygen radicals, but is not limited to them. Although the removing unit is applied to the electron beam drawing apparatus in the first embodiment, it may be applied to a charged-particle beam drawing apparatus for drawing using a charged-particle beam other than an electron beam.

Second Embodiment

A drawing apparatus according to the second embodiment is applied to an EUV (Extreme UltraViolet) exposure apparatus for drawing a pattern on a substrate using extreme ultraviolet light having a wavelength of about 13 nm. FIG. 2 is a schematic view showing the EUV exposure apparatus. The EUV exposure apparatus uses EUV light to transfer a pattern formed on a reticle (original) 37 to a wafer (substrate) 12. The EUV exposure apparatus includes a light source unit for generating EUV light, an illumination optical system for guiding the generated EUV light to the reticle, and a projection optical system for guiding, to the substrate, the EUV light which has been reflected by the surface of the reticle 37. The EUV exposure apparatus also includes a wafer stage 13 for moving the wafer (substrate) 12, and a reticle stage 34 for moving the reticle 37. These components are positioned within a chamber 20. Furthermore, the EUV exposure apparatus comprises an exhausting mechanism such as a vacuum pump, and can form a vacuum environment (for example, a pressure of 1E-5 Pa or lower) within the chamber 20 by exhausting the atmosphere from an exhaust port 14.

The light source unit includes a laser 30, a light emitting medium 32, and a condensing mirror 31. The laser 30 irradiates the light emitting medium 32 with a laser beam to extract EUV light, and the condensing mirror 31 condenses the extracted EUV light. The EUV light from the condensing mirror 31 is reflected by a multi-layer mirror 35 serving as an illumination optical system, and guided to the reticle 37. After the EUV light is reflected by the surface of the reticle 37, it is reflected by the multi-layer mirrors 36a to 36f serving as a projection optical system, and guided to the wafer 12. The projection optical system reduces and projects the pattern of the reticle 37 on the wafer 12.

In such an EUV exposure apparatus, deposits may form on the multi-layer mirrors 35 and 36a to 36f constituting the illumination optical system and projection optical system. The deposits include, for example, a carbon material due to outgas emitted by the members forming the EUV exposure apparatus, or a carbon compound emitted from a resist applied onto the wafer 12. The deposit decreases the reflectance of the EUV light, and reduces a light amount with which the resist is irradiated, thereby decreasing the throughput. In this embodiment, the EUV exposure apparatus has the above-described removing unit. By supplying hydrogen radicals generated by the removing unit to the multi-layer mirrors 35 and 36a to 36f, the hydrogen radicals react with the deposits to decompose and remove the deposits.

A procedure example of removal processing will be explained below. A first catalyst 18 and a second catalyst 15 are moved by a moving mechanism 5 for the first catalyst and the wafer stage 13 to the optical path of the EUV light. The first catalyst 18 and second catalyst 15 are configured so that at least part of each catalyst is irradiated with the EUV light when the catalyst enters the optical path of the EUV light. Although the first catalyst 18 is a wire catalyst and the second catalyst 15 is a plate catalyst in this embodiment, the present invention is not limited to this. For example, the first catalyst 18 may be a mesh catalyst. There may be provided a plurality of catalysts having the same functions as those of the first catalyst 18 and second catalyst 15. The third catalyst and a moving mechanism for the third catalyst may be provided near the multi-layer mirror 35 serving as an illumination system. An orifice plate (not shown) for restricting intrusion of gas into the light emitting medium 32 may be included. The orifice plate is formed by, for example, a plate member, and has an opening on part of it. The area of the opening is desirably 79 mm$^2$ or smaller. The orifice plate may have a plurality of small openings as long as the total area of the openings is 79 mm$^2$ or smaller. With this arrangement, it is possible to suppress supply of gas to the light emitting medium 32, and also suppress a decrease in intensity of the EUV light due to absorption of the EUV light into the introduced gas.

A first gas introducing pipe 17 and a second gas introducing pipe 16 supply gas to the first catalyst 18 and second catalyst 15, respectively. The gas supplied by the first gas introducing pipe 17 and second gas introducing pipe 16 is desirably supplied near the first catalyst 18 and second catalyst 15, respectively. The gas may be supplied while exhausting it from the exhaust port 14 or the gas may be supplied without exhausting it. At this time, it is possible to stop power supply to members which are not used in the removal processing. The members include, for example, the reticle stage 34 and wafer stage 13. This can prevent electric discharge from occurring between the members when a gas is supplied.

When a gas is supplied and then a desired pressure, for example, 0.1 to 100 Pa is reached near the first catalyst 18 and second catalyst 15, the first catalyst 18 and the second catalyst 15 are irradiated with the EUV light. The timing of irradiating each catalyst is not limited to this. After the first catalyst 18 is irradiated with the EUV light to remove a deposit near the first catalyst 18, it may be removed from the optical path of the EUV light and the second catalyst 15 may be irradiated with the EUV light. When irradiation with the EUV light starts, an active species is generated, the generated active species reacts with the deposits on the multi-layer mirrors, and the deposits are decomposed. The decomposed deposits are exhausted outside the chamber 20 via the exhaust port 14.

Upon completion of removal of the deposits, irradiation with the EUV light is stopped, and supply of the gas from the first gas introducing pipe 17 and second gas introducing pipe 16 is also stopped.

Whether removal of the deposits is complete may be determined, by irradiating a detector (not shown) with the EUV light, depending on whether a desired light amount is obtained. Alternatively, when a preset period of time elapses, it may be determined that the deposits have been removed. The moving mechanism 5 for the first catalyst and the wafer stage 13 remove the first catalyst 18 and second catalyst 15 from the optical path of the EUV light, and then the removal processing ends. Although FIG. 2 shows a case in which the deposits are removed from the multi-layer mirrors 36a to 36f, the arrangement may be used to remove deposits from other members or members other than the members. According to this embodiment, since it is possible to shorten the time required for the removal processing, it is also possible to improve the productivity (throughput) of the EUV exposure apparatus.

[Method of Manufacturing Device]

A method of manufacturing a device using a drawing apparatus which draws a pattern using an energy beam will be described. As a device, for example, a semiconductor device or liquid crystal display device is manufactured. A semiconductor device is manufactured by a preprocess of forming an integrated circuit on a wafer, and a post-process of completing, as a product, a chip of the integrated circuit formed on the wafer by the preprocess. The preprocess includes a step of drawing, using the above-mentioned drawing apparatus, a pattern on the wafer coated with a photoresist, and a step of developing the wafer with the pattern drawn. The post-process includes an assembly step (dicing and bonding) and a packaging step (encapsulation). A liquid crystal display device is manufactured by a step of forming a transparent electrode. The step of forming a transparent electrode includes a step of applying a photoresist onto a glass substrate on which a transparent conductive film is deposited, a step of drawing, using the above-mentioned drawing apparatus, a pattern on the glass substrate coated with the photoresist, and a step of developing the glass substrate with the pattern drawn. The method of manufacturing a device according to this embodiment can manufacture a device with a quality higher than those of devices manufactured by the prior arts.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-009198 filed Jan. 19, 2011, which is hereby incorporated by reference herein in its entirety.

What is claimed is:

1. A drawing apparatus for drawing a pattern on a substrate using an energy beam generated by an energy beam source, the apparatus comprising:
   a first member positioned between the energy beam source and the substrate and on which a deposit is deposited; and
   a removing unit which removes the deposit,
   wherein said removing unit includes:
   a first catalyst for generating, from a gas, an active species for decomposing the deposit by irradiation with the energy beam;
   a supplying mechanism for supplying the gas to a position where the active species is generated; and
   a moving mechanism for moving, when executing processing of removing the deposit, the first catalyst to a first position which is irradiated with the energy beam, and moving, when executing drawing processing on the substrate, the first catalyst to a second position which is not irradiated with the energy beam.

2. The apparatus according to claim 1, wherein the first catalyst is mounted on a stage for supporting with the substrate, and is moved between the first position and the second position by the stage.

3. The apparatus according to claim 1, wherein said moving mechanism moves the first catalyst, formed to have the same shape as that of the substrate, between a position, on a stage which moves while being mounted with the substrate, where the substrate is to be mounted and a position where the first catalyst is stored and irradiation with the energy beam is not performed.

4. The apparatus according to claim 1, further comprising a restricting mechanism which restricts, when executing the removal processing, intrusion of the gas, that is supplied from said supplying mechanism, into the energy beam source.

5. The apparatus according to claim 4, wherein said restricting mechanism includes an orifice plate which has an opening and is movable in a direction perpendicular to a passage direction of the energy beam.

6. The apparatus according to claim 1, further comprising:
a second member on which a deposit is deposited and which is positioned, between the energy beam source and the substrate, closer to a side of a stage that moves while being mounted with the substrate as compared with said first member; and
a second catalyst for generating, from a gas, an active species for decomposing, by irradiation with the energy beam, the deposit is deposited on said second member,
wherein the first catalyst is formed to have a shape such that the first catalyst is irradiated with a part of the energy beam, while the second catalyst is irradiated with another part of the energy beam.

7. The apparatus according to claim 6, wherein the first catalyst is a wire or mesh catalyst.

8. The apparatus according to claim 1, wherein the gas contains hydrogen, with active species thereof including hydrogen radicals, and said first catalyst contains at least one of tungsten, platinum, molybdenum, nickel, rhenium, or tantalum.

9. The apparatus according to claim 1, wherein the energy beam is a charged-particle beam or extreme ultraviolet light.

10. A method of manufacturing a device, the method comprising the steps of:
drawing a pattern on a substrate using a drawing apparatus which uses an energy beam generated by an energy beam source;
developing the substrate with the pattern drawn; and
processing the developed substrate,
wherein the drawing apparatus includes:
a member positioned between the energy beam source and the substrate and on which a deposit is deposited; and
a removing unit which removes the deposit, and
wherein the removing unit includes:
a catalyst for generating, from a gas, an active species for decomposing the deposit by irradiation with the energy beam;
a supplying mechanism for supplying the gas to a position where the active species is generated; and
a moving mechanism for moving, when executing processing of removing the deposit, the catalyst to a first position which is irradiated with the energy beam, and moving, when executing drawing processing on the substrate, the catalyst to a second position which is not irradiated with the energy beam.

* * * * *